United States Patent [19]
Bannai et al.

[11] Patent Number: 5,105,315
[45] Date of Patent: Apr. 14, 1992

[54] ERROR COMPENSATION USING AN INSERTED REFERENCE WAVEFORM

[75] Inventors: Tatsushi Bannai; Mitsuo Chiba, both of Katano, Japan

[73] Assignee: Matsushita Electric Industrial Co., Ltd., Japan

[21] Appl. No.: 105,441

[22] Filed: Oct. 1, 1987

Related U.S. Application Data

[63] Continuation of Ser. No. 763,604, Aug. 8, 1985, abandoned.

[30] Foreign Application Priority Data

Aug. 11, 1984 [JP] Japan .................. 59-168245

[51] Int. Cl.⁵ .................................. G11B 27/36
[52] U.S. Cl. ........................... 360/31; 360/27; 358/315; 358/319
[58] Field of Search ............................ 360/66

[56] References Cited

U.S. PATENT DOCUMENTS

| | | | |
|---|---|---|---|
| 3,532,808 | 10/1970 | Fujisawa | 360/27 |
| 3,572,065 | 3/1971 | Heigls, Jr. et al. | 358/21 V |
| 3,588,333 | 6/1971 | de Niet et al. | 360/27 |
| 3,643,013 | 2/1972 | Lemoine | 360/27 |
| 3,717,721 | 2/1973 | Makara et al. | |
| 3,809,805 | 5/1974 | Kasprzak | |
| 3,885,093 | 5/1975 | Mooney | |
| 4,169,219 | 9/1979 | Beard | 360/27 X |
| 4,183,065 | 1/1980 | Rhody et al. | 360/27 X |
| 4,246,615 | 1/1981 | Shiraishi et al. | 360/8 |
| 4,312,020 | 1/1982 | Hasegawa | 360/31 X |
| 4,326,219 | 4/1982 | Griesshaber | 358/139 X |
| 4,352,130 | 9/1982 | Hasegawa et al. | 360/66 |
| 4,384,302 | 5/1983 | Schwarz | 358/318 X |
| 4,400,742 | 8/1983 | Yamamitsu et al. | 360/27 X |
| 4,491,877 | 1/1985 | Kanamaru | 358/336 |
| 4,577,340 | 3/1986 | Watanabe | 358/340 |
| 4,598,324 | 7/1986 | Efron et al. | 360/31 X |
| 4,616,270 | 10/1986 | Nishimoto | 360/37.1 X |
| 4,642,682 | 2/1987 | Orsturn et al. | 358/80 |

FOREIGN PATENT DOCUMENTS 55-645  1/1980  Japan .................. 358/310

OTHER PUBLICATIONS

English Translation of JP 55-645.
The American Heritage Dictionary of the English Language ©1969, p. 850, re definition of "Monotonic".
"A NCWLSI Integrated Circuit for Line Recognition and VIR Signal Processing in Television Receivers"; Barton et al., IEEE, vol. CE-24, No. 3, Aug. 78.
"Digital VITS Generator for Television Broadcasting", Akiyama et al., NEC Res. & Rev. (Japan, No. 63, Oct. 1981.
"Communication Systems & Techniques", Schwartz et al., McGraw-Hill ©1966, pp. 353, 358, 366.

Primary Examiner—Aristotelis Psitos
Attorney, Agent, or Firm—Lowe, Price, LeBlanc & Becker

[57] ABSTRACT

A signal processing apparatus comprises a reference inserting circuit for inserting a reference waveform, preferably a ramp, at periodic intervals into an analog information signal. The reference waveform varies in the range of amplitude variations of the information signal. A reference detector circuit detects the inserted reference waveform from the signal as the latter is reproduced from a recording medium or received through a transmissions medium. The detected reference waveform and the information signal are alternately applied to a correction circuit having a which stores a signal describing the relationship between the original reference waveform and the detected reference waveform which has been affected by errors present in the apparatus. The correction circuit is periodically operative in response to detection of error-affected reference waveform and transforms the waveform of the information signal according to the stored signal.

31 Claims, 6 Drawing Sheets

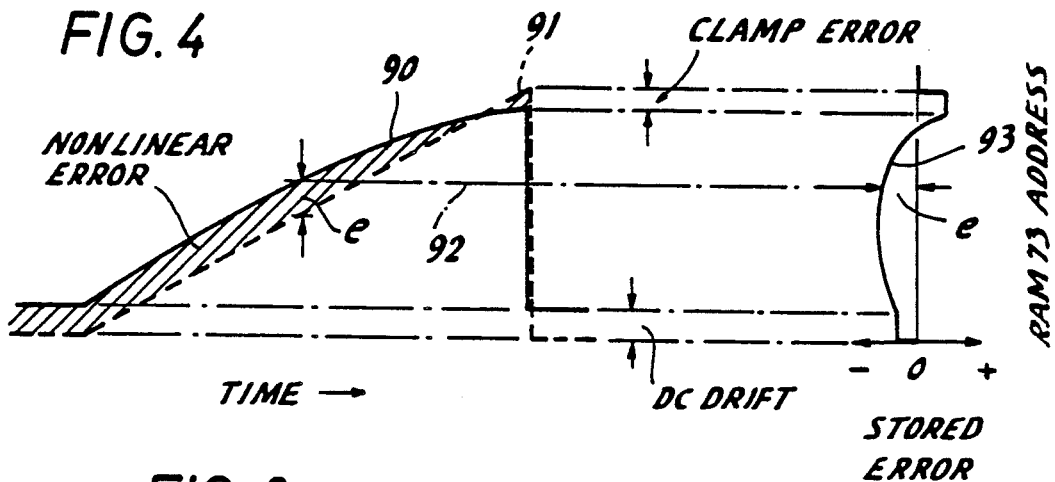
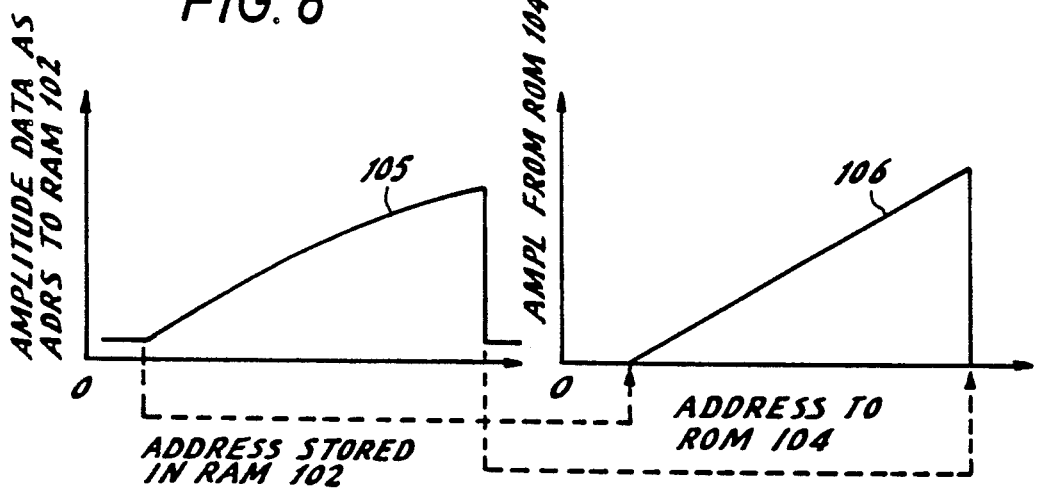
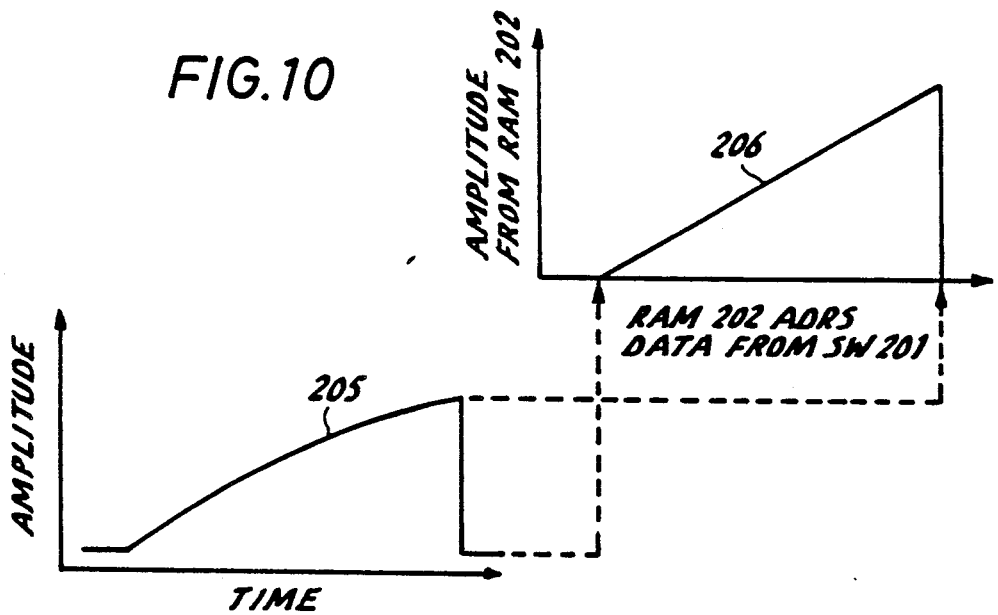

ERROR COMPENSATION USING AN INSERTED REFERENCE WAVEFORM

This application is a continuation of application Ser. No. 763,604, filed Aug. 8, 1985 now abandoned.

BACKGROUND OF THE INVENTION

The present invention relates generally to error compensation particularly advantageous to high quality signal processing apparatus such as video recording and/or reproducing apparatus.

Waveform distortion resulting from the inherent nonlinear characteristics of analog electronic circuitry is of primary concern to the design of high quality signal processing systems. In video recording, the waveform distortion is accounted for not only by the nonlinear characteristics of frequency modulators and demodulators, but by DC drift and clamping voltage deviation which combine to produce a waveform different from the original. The distortion problem becomes serious when it is desired to record a signal of high information density such as broadcast satellite television signals. It has been proposed to record such a high density video signal by splitting it into two channel components at alternate horizontal lines and expanding them on a time scale twice as long as the duration of the original in an attempt to relax the high quality requirements. If the separated video channels are affected differently from each other while passing through respective analog electronic circuits, horizontal lines are likely to appear to "crawl" on the video screen.

SUMMARY OF THE INVENTION

Accordingly, an object of the present invention is to provide a signal processing apparatus having an error correction circuit for eliminating waveform distortion determined by a number of error factors. The invention is particularly useful for both recording systems and communications systems.

In a broader aspect of the invention, a signal processing apparatus comprises a reference inserting circuit for inserting a reference waveform, preferably a ramp, at periodic intervals into an analog information signal. The reference waveform varies through the range of amplitude variations of the information signal. A reference detector circuit separates the inserted reference waveform from the signal as the latter is reproduced from a recording medium or received through a transmissions medium. The separated reference waveform and the information signal are alternately applied to a correction circuit having an output describing the relationship between the original reference waveform and the separated reference waveform which has been affected, by errors present in the apparatus. The correction circuit generates is operative at periodic intervals in response to detection of an error-affected reference waveform to correct the waveform of the information signal.

In a preferred embodiment, the correction circuit includes a memory in which correction factors are stored and updated in response to detection of an error-affected reference waveform. The correction factors are subsequently read out of the memory as a function of the instantaneous amplitude value of the information signal to enable the information signal to be reformed without the errors. The present invention is utilized to the fullest advantage if the signal is treated in digital form.

In a specific aspect, the invention provides a video recording and reproducing apparatus. The apparatus comprises a channel separation circuit for separating a video signal into first and second channel components so that the first channel component includes odd-numbered lines and the second channel component includes even-numbered lines. During recording modes, a reference inserting circuit generates a reference waveform, inserts it into the vertical blanking period of each channel and applies the channel components to a recording medium through first and second transducer circuits respectively. The reference waveform varies in amplitude in the range from the white level to the black level of the television picture.

During playback, a first reference detector is coupled to the first transducer circuit for separating the reference waveform from the first channel component and a second reference detector is coupled to the second transducer circuit for separating the reference waveform from the second channel component. The waveform of the first channel component is corrected to a distortion-free waveform by a first correction circuit according to a first function describing the relationship between the original reference waveform and the reference waveform detected by the first reference detector. The waveform of the second channel component is also corrected to a distortion-free waveform by a second correction circuit according to a second function describing the relationship between the original reference waveform and the reference waveform detected by the second reference detector. The corrected first and second channel components are recombined in a channel recombining circuit to generate a signal which is a replica of the original video signal.

BRIEF DESCRIPTION OF THE DRAWINGS

The present invention will be described in further detail with reference to the accompanying drawings, in which:

FIG. 4 is a waveform diagram associated with the embodiment of FIG. 1 wherein one of the illustrated waveforms is a monotonic ramping waveform of amplitude vs. time;

FIG. 8 is a pair of monotonic ramping waveform associated with the embodiment of FIG. 7;

FIG. 10 is a pair of monotonic ramping waveforms associated with the embodiment of FIG. 9.

DETAILED DESCRIPTION

Figure 1:
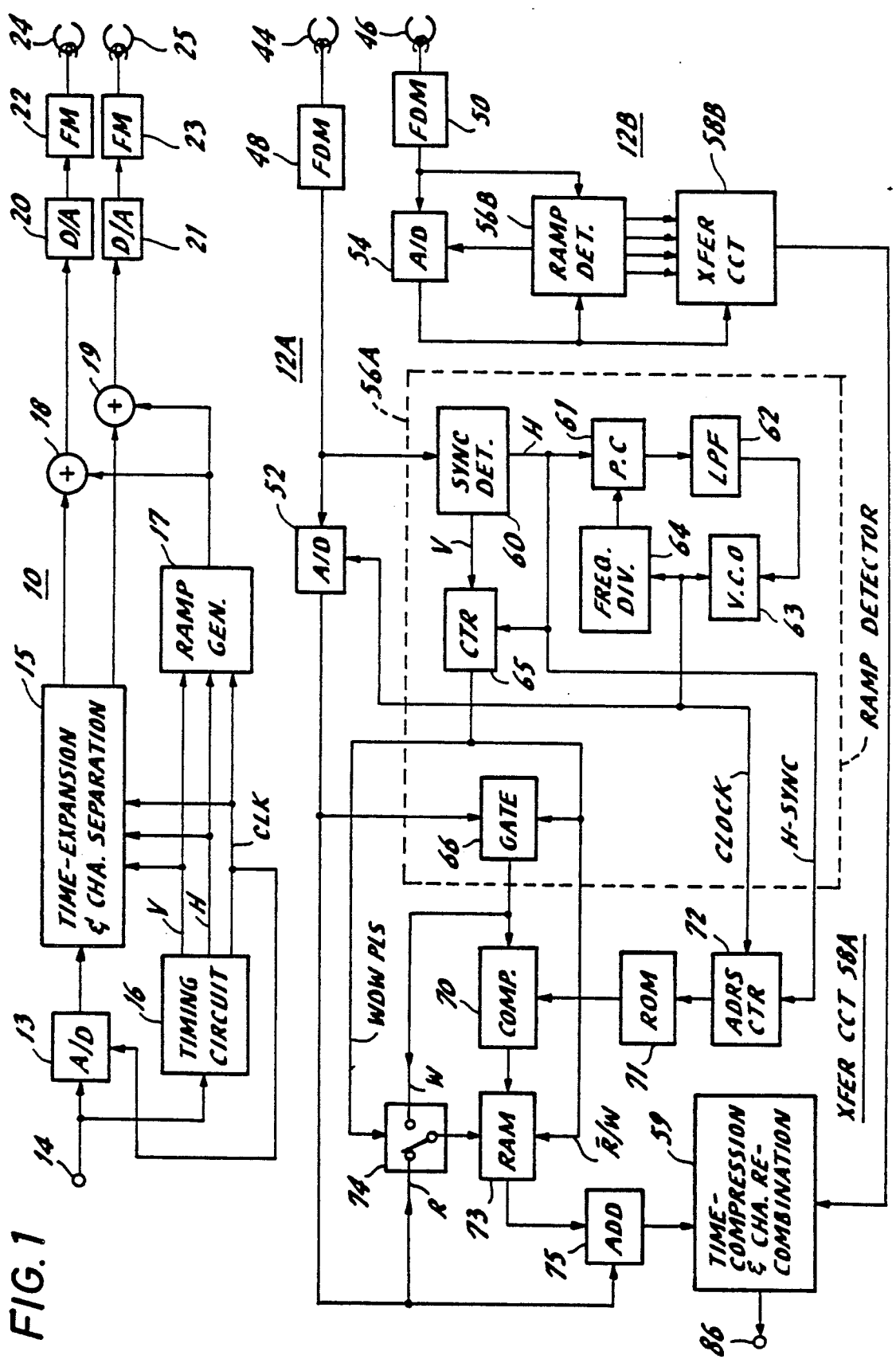
FIG. 1 is a schematic block diagram of a preferred embodiment of a video recording and/or reproducing apparatus of the present invention.

FIG. 1 is a block diagram of a preferred embodiment of a video tape recording and/or reproducing apparatus in accordance with the present invention. The apparatus generally comprises a two-channel recording circuit 10, a first channel playback circuit 12A and a second channel playback circuit 12B. The two-channel recording circuit 10 comprises an analog-to-digital converter 13 connected to an input terminal 14 to which a high-quality television signal is applied. Such high-quality television signals are transmitted in a frequency modulation format from broadcast satellites and frequency demodulated upon reception before being applied to the input terminal 14. The input video signal is converted to digital form and applied to a time-expansion and channel separation circuit 15 which expands the time duration of the input signal by a factor of two and splits it into two channel components in a manner described in detail below.

The analog input signal is also applied to a timing circuit 16. Timing circuit 16 detects horizontal line sync and vertical blanking pulses to generate clock pulses at a frequency which is an integral multiple of the line frequency. Circuit 16 supplies the timing signals, including the detected line sync and blanking pulse, to time-expansion and channel separation circuit 15 and are digital ramp generator 17. The clock pulses are further applied to analog-to-digital converter 13 to synchronize its timing with the time base. Ramp, generator 17 includes a counter that generates line counting sync pulses in response to a blanking pulse from the timing circuit 16 to detect a predetermined line sync within the vertical blanking. Generator 17 further includes a read only memory storing digital ramp data and an address counter which addresses the memory in response to the clock pulse to generate a stepped digital ramp varying from the white level to black level of a television picture.

The digital ramp is applied to adders 18 and 19 and inserted into the two-channel video components at the time position of the predetermined line sync period of each vertical blanking interval. The outputs of adders 18 and 19 are converted to analog form by digital-to-analog converters 20, 21, frequency modulated by modulators 22, 23 and fed to video transducer heads 24, 25. The video heads 24 and 25 are mounted on the circumference of a rotary drum of any well known video tape loading mechanism such that they follow parallel tracks skewed relative to the length of video tape. The reduction of signal density relaxes the quality requirements of video tapes and tape operating mechanisms.

Figure 2:
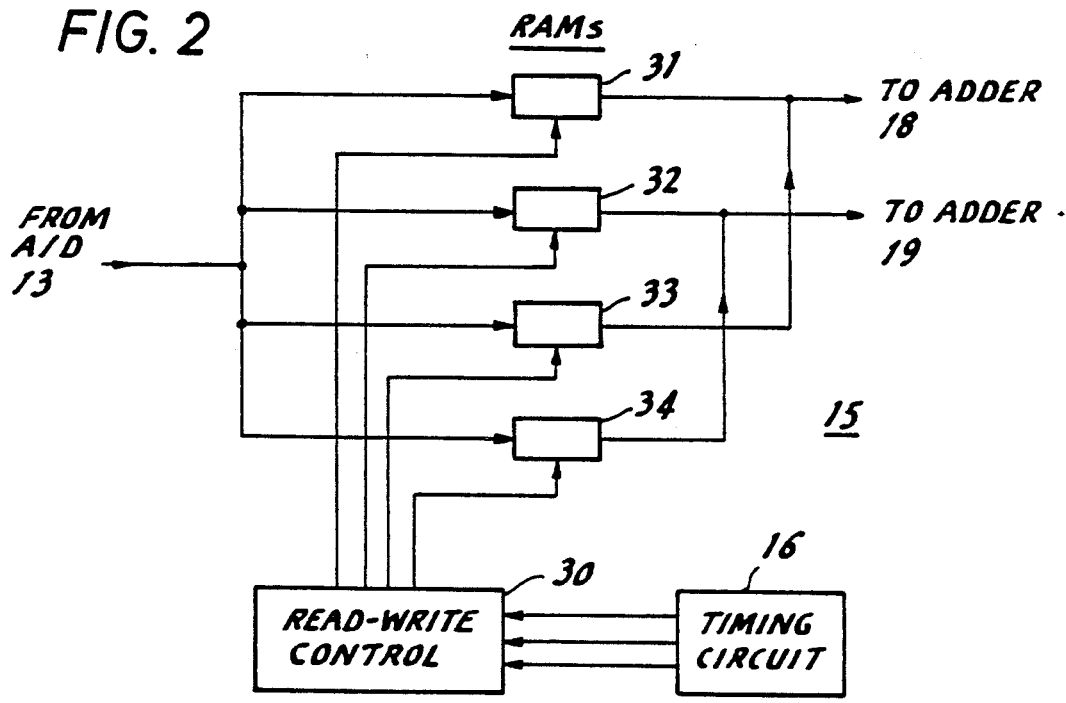
FIG. 2 is an illustration of details of the time-expansion and channel separation circuit of FIG. 1.
Figure 3:
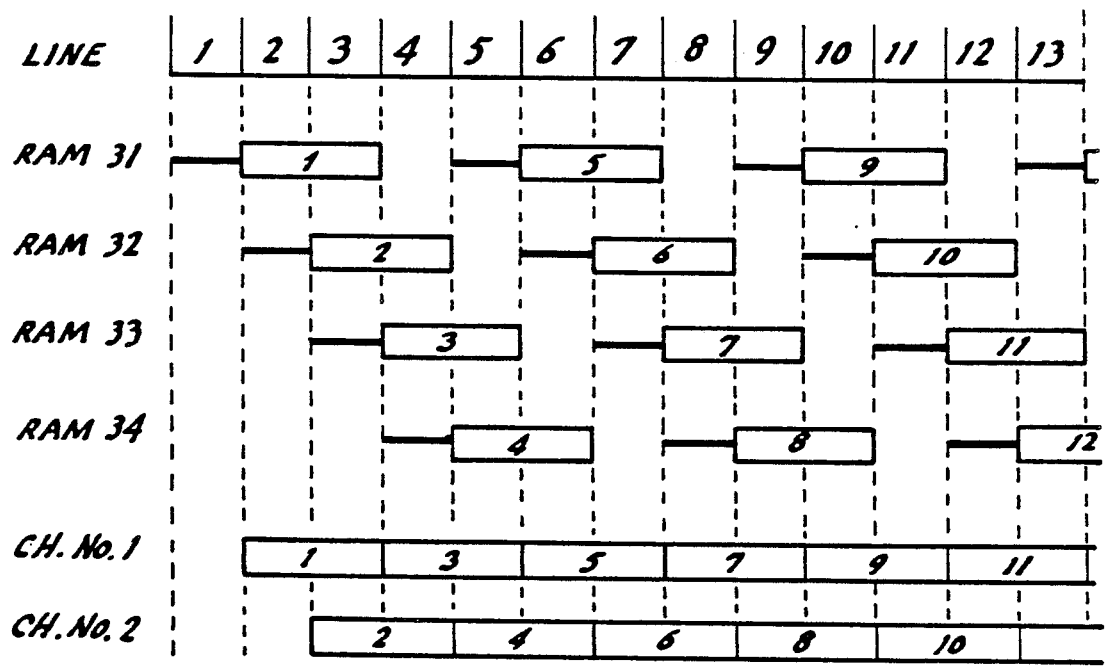
FIG. 3 is a timing diagram useful for describing the operation of the circuit of FIG. 2.

Referring to FIG. 2, time-expansion and channel separation circuit 15 includes a plurality of random access memories (RAMs) 31 to 34 and a read-write control circuit 30. RAMs 31 to 34 have data input terminals coupled together to the output of analog-to-digital converter 13; RAMs 31 and 33 have data output terminals coupled together to the input of adder 18 while RAMs 32 and 34 have data output terminals coupled together to the input of adder 19. Read-write control circuit 30 receives timing pulses from timing circuit 16 to perform read-write operations on the individual memories in accordance with a timing diagram shown in FIG. 3. Read-write control circuit 30 recyclically addresses RAMs 31 through 34 to write video line signals into the respective RAMs and subsequently read the stored line signals at one half the rate of the write operations. Odd-numbered, time-expanded line signals from RAMs 31 and 33 occur in succession to generate a first channel video component as an input signal to adder 18 and even-numbered, time-expanded line signals from RAMs 32 and 34 occur in succession to generate a second channel video component as an input signal to adder 19.

Returning to FIG. 1, the recorded time-expanded two-channel video components are detected by video heads 44 and 46 and demodulated by frequency demodulators 48, 50, thence passed through known processing circuits including amplifiers, filters and clampers, not shown, and converted to digital form by analog-to-digital converters 52 and 54, respectively. The first channel playback circuit 12A generally includes a ramp detector 56A and error correction circuit 58A, and similarly, the second channel playback circuit 12B generally includes a ramp detector 56B and error correction circuit 58B which are identical in construction to the circuits 56A and 58A, respectively.

The ramp detector 56A comprises a sync detector 60 which is connected to the demodulator 48 to detect line sync pulses and vertical blanking pulses. A phase-locked loop responsive to the vertical blanking pulses include phase comparator 61, low-pass filter 62, voltage-controlled oscillator 63 and frequency divider 64, all of which are connected in a loop so that phase comparator 61 compares the phase of the detected line sync pulse with the output of frequency divider 64. The output of VCO 63 is applied as a clock pulse to the analog-to-digital converter 52 to synchronize timing of the converter with a time base derived by the VCO. Ramp detector 56A also includes counter 65 and gate 66. Counter 65, responsive, to sync detector 60 to, counts the line, sync pulses to generate a window pulse. This window pulse is applied to one input of gate 66, having a second input connected to the output of analog-to-digital converter 52. Gate 66 responds to the input signals thereof to extract the inserted digital ramp from the first-channel digital video component.

Correction circuit 58A includes digital comparator 70, of a type which compares two digital inputs applied thereto and generates a digital output indicating the difference between them, and further includes a read only memory 71 and an address counter 72. The ROM 71 stores a, set of digital instantaneous values for a ramp waveform; the values are sequentially read out of the ROM to one input of the comparator 70 in response to the address counter 72 output. Address counter 72 is connected to VCO 63 and sync detector 60 to generate a series of address codes in response to the clock pulses. Counter 72 repeats the process in response to each line sync pulse to generate a digital ramp waveform which is applied to comparator 70 as a reference waveform. A second input to comparator 70, from gate 66, is the extracted digital ramp the comparator detects the difference in digital values of the inputs thereof. This difference is an instantaneous value indicating the magnitude and polarity of the deviation of the instantaneous amplitude value of the reproduced first-channel video signal from the instantaneous amplitude value of the reference waveform.

The instantaneous difference values are sequentially stored as a level correction signal in locations of a random access memory 73 specified by address codes supplied from the output of a switch 74. RAM 73 is switched to a write mode in response to the window pulse from counter 65 and switched to a read mode in the absence of the window pulse. Switch 74 has a write-address input W connected to the output of gate 66 and a read-address input R connected to the output of analog-to-digital converter 52. The switch 74 is responsive to the window pulse from counter 65 to establish a path between its write-address input W to the address input of RAM 73 and in the absence of the window pulse it establishes a path between the read-address input R to the address input of RAM 73.

It will be seen therefore that when a digital ramp occurs the counter 65 supplies a window pulse to switch 74 and the instantaneous amplitude value of the detected digital ramp is applied from gate 66 through switch 74 to the address input of RAM 73. A set of error correction digital values are stored in locations which can be addressed as a function of the instantaneous level of the reproduced signal. There is therefore a particular error correction value for each particular signal level. When switch 74 is returned to the read-address input position R, the amplitude representing output of analog-to-digital converter 52, which is affected by the inherent errors, addresses RAM 73 to read the error correction values, which are fed to adder 75 and summed with the video signal from A/D converter 52.

The operation of correction circuit 58, FIG. 1, is more clearly understood with reference to FIG. 4. The video signals are distorted by nonlinear errors, DC drifts and clamp voltage deviations as indicated by a solid-line reference waveform 90, when processed by frequency modulators 22, 23 (prior to recording) and by frequency demodulators 48, 50 and other circuits including amplifiers, filters and clampers (not shown) during playback. Waveform 90 derived at the output of gate 66 during each vertical blanking interval which occurs simultaneously with derivation of each window pulse at the output of counter 65. Comparator 70 detects the difference between the distorted ramp waveform and the reference monotonic ramp waveform 91 derived from ROM 71 and supplies a difference signal 93 RAM 73 which stores the magnitude and polarity of the difference. For example, distorted waveform 90 deviates at a given level 92 by an amount "e" from reference monotonic waveform 91 and the difference "e" is stored in RAM 73 at a location specified by the level 92. Waveform 93 indicates the error values stored at different addresses in RAM 73. The addition of the error values to the distorted actual video signals by adder 75 compensates for such error at each amplitude level of the output of converter 52.

Each of correction circuits 58A and 58B therefore derives an output indicative of the relationship between the reference and distorted ramp waveforms to modify the distorted video signal so it becomes a distortion-free waveform according to the signals stored therein. By the error corrective action, the video waveforms on both channels are made substantially equal to each other, thus eliminating "line crawling" which would otherwise occur on the video screen due to the waveform imbalance that would otherwise occur between the two channel signals.

Figure 5:
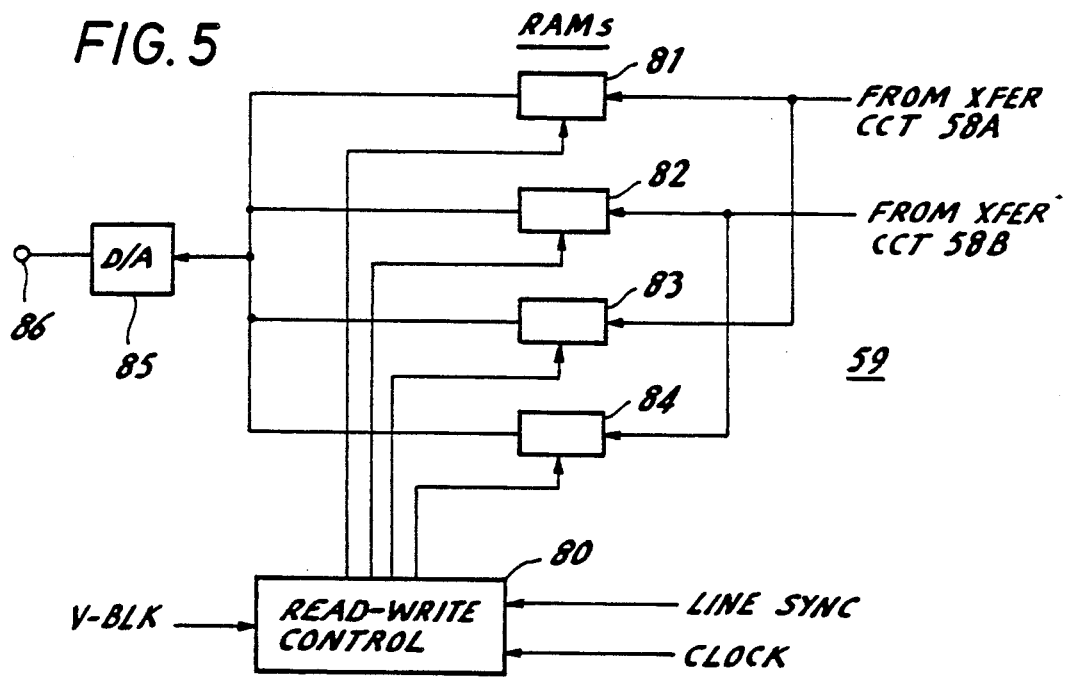
FIG. 5 is an illustration of details of the time-compression and channel recombination circuit of FIG. 1.

The error compensated outputs of adders 75 of each correction circuit 58 are supplied to a time-compression, and channel recombination circuit 59, details of which are shown in FIG. 5. The time-compression and channel recombination circuit 59 includes a plurality of RAMs 81 through 84 and a read-write control circuit 80. RAMs 81 and 83 have data input terminals coupled together to the output of transfer circuit 58A, RAMs 82 and 84 have data input terminals coupled together to the output of transfer circuit 58B. The data output terminals of the RAMs 81 to 84 are connected together to the input of a digital-to-analog converter 85 and thence to a video output terminal 86.

Figure 6:
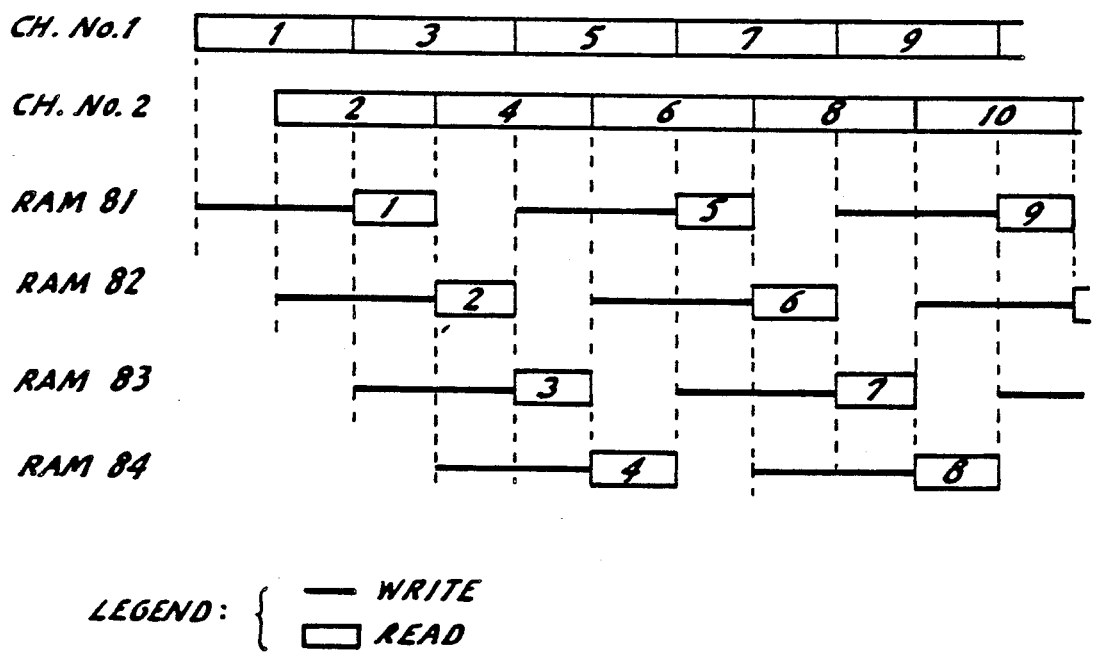
FIG. 6 is a timing diagram useful for describing the operation of the circuit of FIG. 5.

Read-write control circuit 80 responds to the vertical blanking pulse, line sync pulse and clock pulse from one of the ramp detectors 56A and 56B to derive address codes to effect read/write operations in accordance with a timing diagram shown at FIG. 6. RAMs 81 through 84 are recyclically addressed to store time-expanded line signals in sequence. Subsequently the stored signals are read at a rate twice that of the rate of the write operations. The line signals read from these memories are therefore time-compressed to the original time scale and arranged in the original order of appearance at the input of D/A converter 85, that generates a signal which is a replica of the signal applied to the input terminal, 14 of the apparatus.

Figure 7:
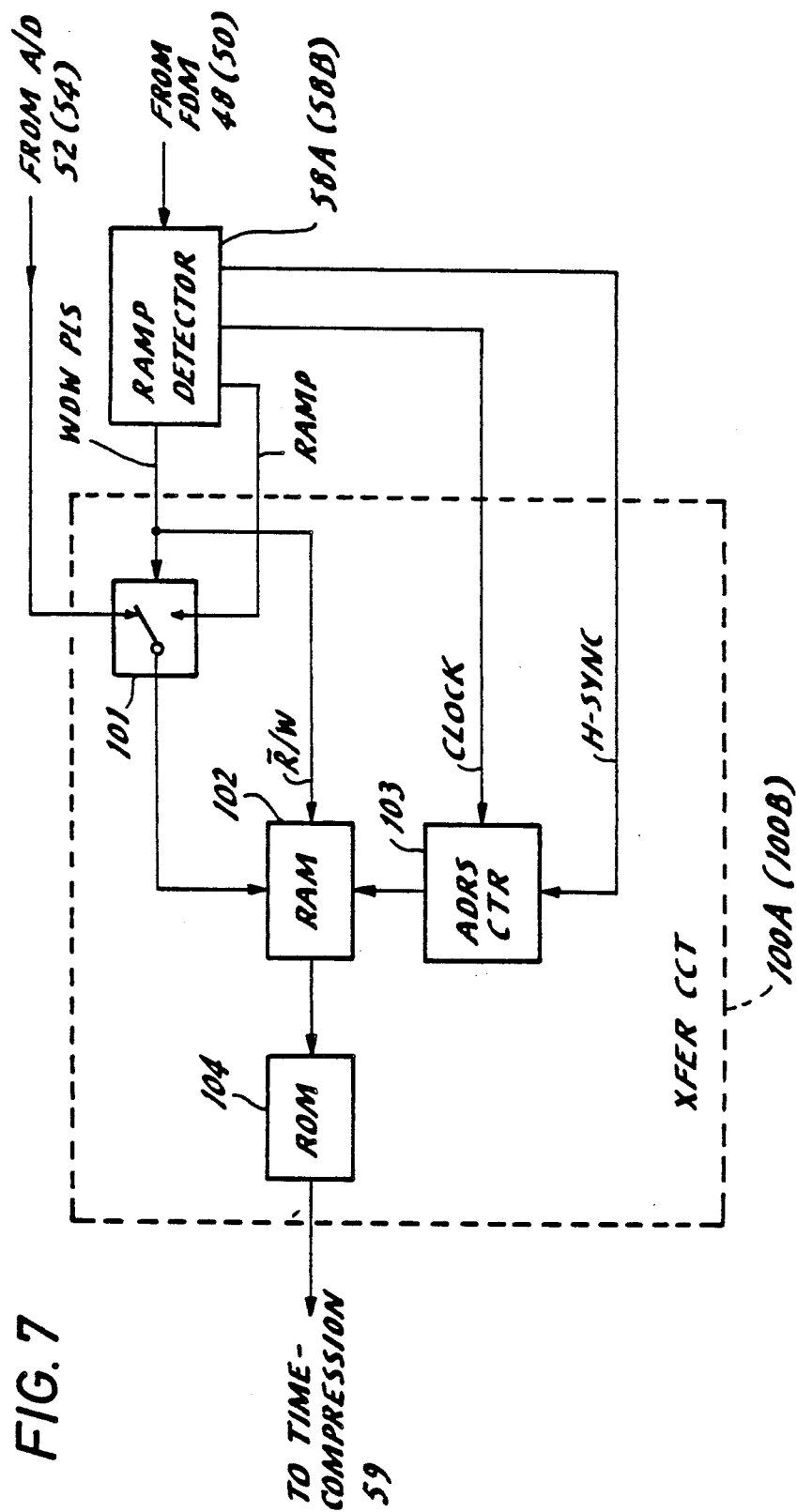
FIG. 7 is a block diagram of a modified form of the transfer circuit of FIG. 1.

FIG. 7 is a block diagram of a modified form of the error corrector circuit. In this modification, circuit 100 differs from correction circuit 58 of the previous embodiment because it replaces the comparator 71 with RAM 102 that stores periodic address-data supplied to it from address counter 103 via switch 101. The address data are a function of the instantaneous value of the distorted ramp output of ramp detector 58. RAM 102 reads the stored address data as a function of the instantaneous value of the actual video signal from A/D converter 52 (or 54). The instantaneous amplitude value of a distorted ramp waveform 105, FIG. 8, is converted to a corresponding address value in RAM 102. Read only memory 104 stores a reference monotonic ramp waveform 106 identical to that inserted to the recorded video signal. The instantaneous value of this stored reference waveform is read as a function of the address data which is in turn read out of RAM 102 as a function of the amplitude data supplied to its address input via switch, 101. In response to distorted waveform 105 being read into RAM 102 from converter 52, a linear monotonic ramp waveform is derived by ROM 104. Thus, correction circuit 100 stores signals describing the relationship between the distorted reference waveform and the undistorted reference waveform and converts the waveform of the actual video signal from A/D converter 52 (54) into an accurate indication of the signal at terminal 14.

Figure 9:
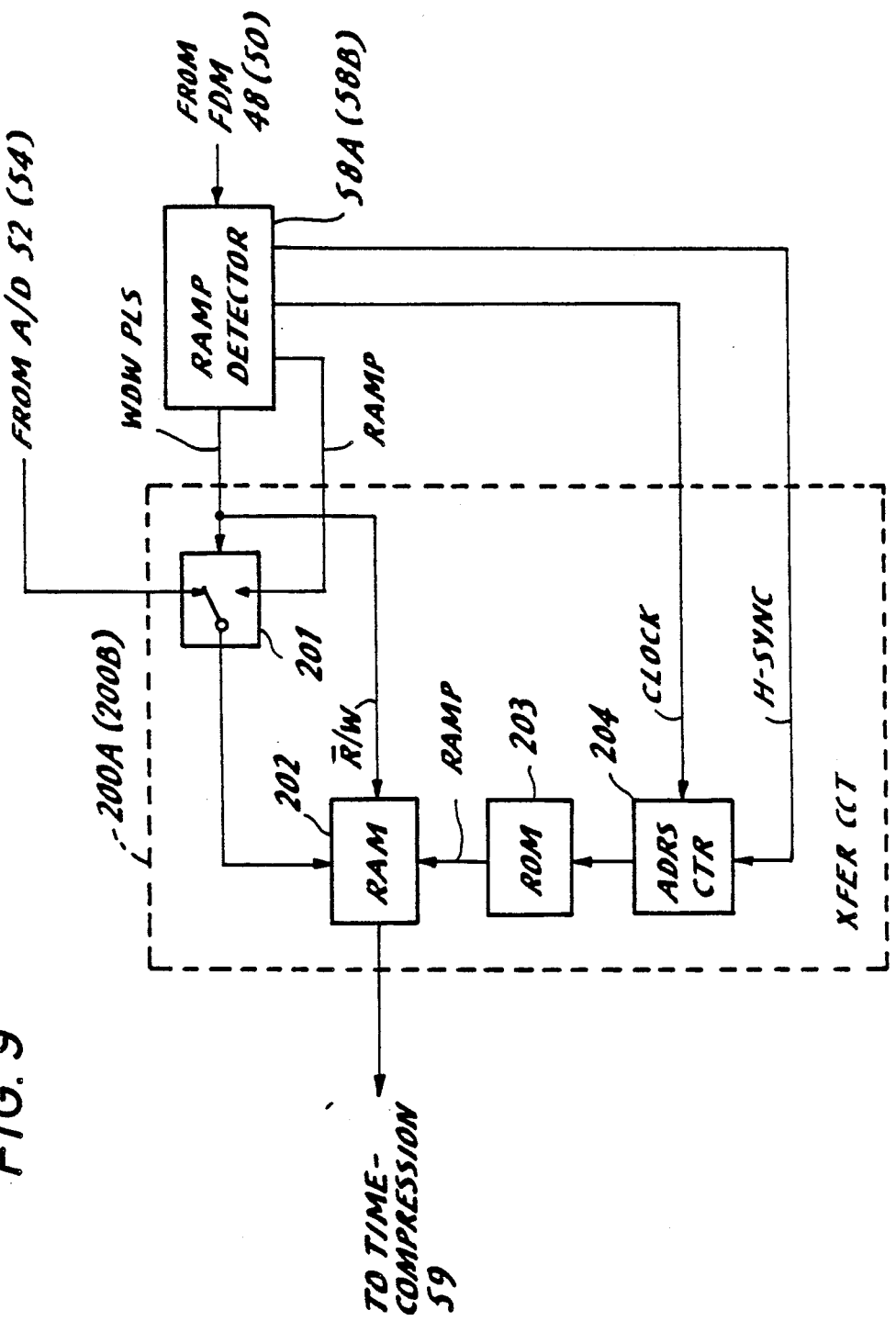
FIG. 9 is a block diagram of another form of the modification.

FIG. 9 is an illustration of a further modified form of the correction circuit which differs from the correction circuit 100 of FIG. 7 in that ROM 203, which stores the reference monotonic ramp waveform, is addressed by the output of address counter 204 and supplies a reference monotonic ramp to RAM 202 which is addressed by signals supplied to it via switch 201 in a manner similar to RAM 102 of FIG. 7. In response to a window pulse, RAM 202 is addressed in write mode as a function of the amplitude of ramp 205, FIG. 10, from detector 58 to store the reference monotonic ramp from ROM 203. If the same distorted ramp were applied to the address input of RAM 202 in the read mode, linear monotonic ramp 206 would be derived by memory 202.

What is claimed is:

1. A signal processing apparatus for processing an analog information signal, comprising:
   reference waveform generating means for generating a reference waveform having an amplitude continuously variable as a monotonic ramping function of time in the full range of amplitudes of said information signal;
   reference inserting means for inserting said continuously variable monotonic ramping reference waveform over the full range of amplitudes at periodic intervals into said signal for application to a utilization means in which the information signal and the inserted reference waveform are likely to be affected by an error;

reference detecting means for detecting the full range of amplitudes of the inserted continuously variable monotonic ramping reference waveform from the information signal derived from said utilization means; and correction circuit means for storing indications describing the relationship between the amplitudes of said monotonic ramping reference waveform over the full range of values inserted by said inserting means and the amplitudes of the detected reference waveform and eliminating deviations of the amplitudes of said information signal derived from said utilization means with respect to the full range of amplitudes of the information signal which is supplied to said utilization means according to said stored indications.

2. A signal processing apparatus as claimed in claim 1, wherein said correction circuit means comprises:

second waveform generating means for generating a second reference waveform identical to the reference waveform inserted by said inserting means;

difference detecting means for detecting a difference between said detected reference waveform and said second waveform; and correcting means for correcting the amplitudes of said information signal derived from said utilization means in accordance with said difference detected by said difference detecting means.

3. A signal processing apparatus as claimed in claim 2, wherein said difference detecting means further comprises:

a memory; and memory control means for writing said detected difference into said memory as a function of the amplitude of said detected reference waveform and reading the stored difference out of the memory as a function of the amplitudes of said information signal derived from said utilization means and applying the difference read out of the memory to said correcting means.

4. The apparatus of claim 3 wherein the ramping function is an increasing monotonic ramping function.

5. A signal processing apparatus as claimed in claim 1, wherein said correction means comprises:

a first memory;

means for generating periodic data;

memory control means for writing the periodic data into said first memory as a function of the amplitudes of the detected reference waveform and reading the periodic data out of the first memory as a function of the amplitudes of said information signal derived from said utilization means; and a second memory storing a second reference waveform identical to the reference waveform inserted by said inserting means, said second memory being responsive to said periodic data read out of said first memory for reading the second reference waveform stored therein as a corrected information signal.

6. A signal processing apparatus as claimed in claim 1, wherein said correction circuit means comprises:

second waveform generating means for generating a second reference waveform identical to said reference waveform inserted by said inserting means;

a memory; and memory control means for writing the instantaneous amplitudes of said second reference waveform as a function of the amplitudes of said detected reference waveform and reading the stored amplitudes out of said memory as a function of the amplitudes of said information signal from said utilization means as a corrected information signal.

7. A video recording and reproducing apparatus adapted to receive a video signal, comprising:

reference waveform generating means operable during a recording mode of the apparatus for generating a reference waveform having an amplitude continuously variable as a monotonic ramping function of time in a full range from white level to black level of said video signal;

reference inserting means for inserting the full range of the continuously variable monotonic ramping reference waveform into a vertical blanking period of said video signal and applying the video signal to a recording medium through transducer means;

reference detecting means coupled to said transducer means for detecting the full range of the continuously variable inserted monotonic ramping reference waveform from the video signal reproduced by the transducer means during playback mode of the apparatus, the amplitudes of the detected reference waveform being affected by errors which may be present in the apparatus; and correction circuit means for storing indications describing the relationship between the full range of amplitudes of said continuously variable monotonic ramping reference waveform inserted by said inserting means and the amplitudes of the error-affected reference waveform and eliminating deviations of the amplitudes over the full range of said reproduced video signal according to said stored indications.

8. An apparatus as claimed in claim 7, wherein said correction circuit means comprises:

second waveform generating means for generating a second waveform identical to the reference waveform inserted by said inserting means;

difference detecting means for detecting the difference between said error-affected waveform and said second reference waveform; and correcting means for correcting the amplitudes of said reproduced video signal in accordance with said difference detected by said difference detecting means.

9. An apparatus as claimed in claim 8, wherein said difference detecting means further comprises:

a memory; and memory control means for writing said detected difference into said memory as a function of the amplitudes of said error-affected reference waveform and reading the stored difference out of the memory as a function of the amplitudes of said reproduced video signal as a corrected video signal.

10. The apparatus of claim 9 wherein the ramping function is an increasing monotonic ramping function.

11. An apparatus as claimed in claim 7, wherein said correction circuit means comprises:

a first memory;

means for generating periodic data;

memory control means for writing the periodic data into said first memory as a function of the amplitudes of the detected reference waveform and reading the periodic data out of the first memory as a function of the amplitudes of said reproduced video signal; and a second memory storing a second reference waveform identical to the reference waveform inserted by said inserting means, said second memory reading the second reference waveform stored therein in response to said periodic data read out of said first memory as a corrected video signal.

12. An apparatus as claimed in claim 11, wherein said periodic data generating means comprises:

clock generating means for generating a clock pulse synchronously with said reproduced video signal; and an address counter for counting said clock pulse and recyclically generating a series of address data as said periodic data.

13. An apparatus as claimed in claim 7, wherein said correction circuit means comprises:

waveform generating means for generating a second reference waveform identical to said reference waveform inserted by said inserting means;

a memory; and memory control means for writing the instantaneous amplitudes of said second reference waveform as a function of the amplitudes of said detected reference waveform and reading the stored amplitudes out of said memory as a function of the amplitudes of said reproduced video signal as a corrected video signal.

14. A video recording and reproducing apparatus adapted to receive a video signal, comprising:

channel separating means for separating said video signal into a first channel component having odd-numbered lines and a second channel component having even-numbered lines;

reference waveform generating means operable during a recording mode of the apparatus for generating a continuously variable monotonic ramping reference waveform having an amplitude variable as a function of time in a full range from white level to black level of said video signal;

reference inserting means for inserting the full range of the continuously variable monotonic ramping reference waveform into a vertical blanking period of each of said first and second channel components and applying said components to a recording medium through first and second transducer means respectively;

first reference detecting means coupled to said first transducer means for detecting the monotonic ramping reference waveform over the full range from the first channel component reproduced by the first transducer means during playback mode of the apparatus, the detected reference waveform being affected by errors which may be present in the apparatus;

second reference detecting means coupled to said second transducer means for detecting the monotonic ramping reference waveform over the full range from the second channel component reproduced by the second transducer means during playback mode of the apparatus, the detected reference waveform being affected by errors which may be present in the apparatus;

first correction circuit means receptive of said reproduced first channel component and the reference waveform detected by said first detecting means, the first correction circuit means storing first indications describing the relationship between the amplitudes over the full range of said monotonic ramping reference waveform inserted by said inserting means and the amplitudes of the reference waveform detected by said first detecting means for eliminating deviations of the amplitudes over the full range of said reproduced first channel component with respect to the amplitudes of the first channel component supplied to said first transducer means during the recording mode according to said first indications;

second correction circuit means respective of said reproduced second channel component and fhe reference waveform detected by said second detecting means, the second correction circuit means storing second indications describing the relationship between the amplitudes over the full range of said reference waveform inserted by said inserting means and the amplitudes of the reference waveform detected by said second detecting means for eliminating deviations of the amplitudes over the full range of said reproduced second channel component with respect to the amplitudes of the second channel component supplied to said second transducer means during the recording mode according to said second indications; and channel recombining means for recombining output signals from said first and second correction circuit means and generating a signal which is a replica of said video signal.

15. An apparatus as claimed in claim 14, wherein said first correction circuit means comprises:

first waveform generating means for generating a first reference waveform identical to the reference waveform inserted by said inserting means;

first difference detecting means for detecting a first difference between the reference waveform detected by said first detecting means and the first identical reference waveform; and first correcting means for correcting the amplitudes of said reproduced first channel component in accordance with the difference detected by said first difference detecting means, wherein said second correction circuit means comprises:

second waveform generating means for generating a second reference waveform identical to the reference waveform inserted by said inserting means;

second difference detecting means for detecting a second difference between the reference waveform detected by said second detecting means and said second identical reference waveform; and second correcting means for correcting the amplitudes of said reproduced second channel component in accordance with said difference detected by said second difference detecting means.

16. An apparatus as claimed in claim 15, wherein said first difference detecting means further comprises:

a first memory; and first memory control means for writing said first difference into said first memory as a function of the amplitude of said reference waveform detected by said first detecting means and reading the stored first difference out of the memory as a function of the amplitudes of said reproduced first channel component as a corrected first channel component, wherein said second difference detecting means further comprises:

a second memory; and second memory control means for writing said second difference into said second memory as a function of the amplitudes of said reference waveform detected by said second detecting means and reading the stored second difference out of the memory as a function of the amplitudes of said reproduced second channel component as a corrected second channel component.

17. The apparatus of claim 10 wherein the reference waveform is an increasing monotonic ramping function.

18. An apparatus as claimed in claim 14, wherein said first correction circuit means comprises:

a first memory;

first periodic data generating means for generating first periodic data;

first memory control means for writing the first periodic data into said first memory as a function of the amplitudes of the reference waveform detected by said first reference detecting means and reading the first periodic data out of the first memory as a function of the amplitudes of said reproduced first channel component; and a second memory storing a first reference waveform identical to the reference waveform inserted by said inserting means, said second memory reading the first reference waveform stored therein in response to said first periodic data read out of said first memory as a corrected first channel component, wherein said second correction circuit means comprises:

a third memory;

second periodic data generating means for generating second periodic data;

second memory control means for writing the second periodic data into said third memory as a function of the amplitudes of the reference waveform detected by said second reference detecting means and reading the second periodic data out of the third memory as a function of the amplitudes of said reproduced second channel component; and a fourth memory storing a second reference waveform identical to the reference waveform inserted by said inserting means, said fourth memory reading the second reference waveform stored therein in response to said second periodic data read out of said third memory as a corrected second channel component.

19. An apparatus as claimed in claim 18, wherein each of said first and second periodic data generating means comprises:

clock generating means for generating a clock pulse synchronously with said reproduced video signal; and an address counter for counting said clock pulse and recyclically generating a series of address data as each of said periodic data.

20. An apparatus as claimed in claim 14, wherein said first correction circuit means comprises:

first waveform generating means for generating a first reference waveform identical to said reference waveform inserted by said inserting means;

a first memory; and first memory control means for writing the instantaneous amplitudes of said first identical reference waveform as a function of the amplitudes of the reference waveform detected by said first reference detecting means and reading the stored amplitudes out of said first memory as a function of the amplitudes of said reproduced first channel component as a corrected first channel component, wherein said second correction circuit means comprises:

second waveform generating means for generating a second reference waveform identical to said reference waveform inserted by said inserting means;

a second memory; and second memory control means for writing the instantaneous amplitudes of said second reference waveform as a function of the amplitudes of the reference waveform detected by said second reference detecting means and reading the stored amplitudes out of said second memory as a function of the amplitudes of said reproduced second channel component as a corrected second channel component.

21. A method of correcting amplitude distortion introduced in processing an original analog information signal which results in the derivation of an amplitude distorted processed analog information signal comprising the steps of from time to time deriving an original reference waveform having a predetermined continuously variable monotonic ramping amplitude versus time relation over a full range of amplitude values, processing the original monotonic ramping reference waveform in the same manner as the original analog information signal so that the same amplitude distortion is introduced into the original monotonic ramping reference waveform to form a processed reference waveform, the processed reference waveform thereby having the same amplitude distortion as is introduced into the original information signal in forming the amplitude distorted processed analog information signal, responding to the processed amplitude distorted reference waveform during different times of the waveform and indications of the predetermined amplitude thereof at each of the different times corresponding to the full range of values to store a series of values correlating each of the predetermined amplitudes with an amplitude of the processed amplitude distorted reference waveforms, and modifying the amplitude of the amplitude distorted processed analog information signal by a factor determined by the stored correlated value corresponding with the amplitude of the processed information signal so that the amplitude of the modified processed information signal is commensurate with the amplitude of the information signal prior to processing.

22. The method of claim 21 further including periodically superimposing the original reference waveform on the original information signal at a time while the original information signal contains no data so that data and the original reference waveform occur in sequence as a composite signal that is processed, and separating the processed reference waveform from the composite signal to derive the processed amplitude distorted reference waveform.

23. The method of claim 21 wherein the stored values are derived by comparing the amplitudes of the distorted reference waveform with predetermined amplitudes therefor at plural times while the distorted reference waveform is being derived to derive an indication of the relative polarity and numerical values of the distorted reference waveform and the predetermined value therefor at each of the plural times, storing the indications of the relative polarity and numerical values to provide a correction factor for each of the plural amplitude values of the distorted processed information signal, responding to the amplitude of the distorted processed information signal to read out the correction factor associated with the different amplitudes thereof, the amplitude of the processed information signal being modified by combining the correction factor read out for a particular amplitude with the particular amplitude of the distorted processed information signal.

24. The method of claim 21 wherein the stored values are derived by storing time values associated with the amplitude of the processed reference wave at memory addresses determined by the amplitude of the processed reference wave, and the amplitude of the processed information signal is modified by: reading out the stored time values from memory addresses determined by the amplitude of the original information signal, and reading out stored values for the amplitude of the original reference waveform in response to the read out stored time values, the stored amplitude values for the original reference waveform being at memory addresses associated with the time during the reference waveform corresponding to the amplitude of the reference waveform at that time.

25. The method of claim 24 wherein the stored values are derived by storing amplitude values of the original reference wave for predetermined time positions during the processed reference wave at memory addresses determined by the amplitude of the processed reference wave, and the amplitude of the processed information signal is modified by reading out the stored amplitude values from memory addresses determined by the amplitude of the information signal.

26. The method of claim 21 wherein the original reference waveform is an increasing monotonic ramping function.

27. Apparatus for correcting amplitude distortion introduced in processing an original analog information signal which results in the derivation of an amplitude distorted processed analog information signal, wherein the original analog information signal is accompanied by an original reference waveform having a predetermined continuous monotonic ramping amplitude versus time relation over a full range of amplitude values at the time it is derived, the original information signal and original reference waveform being processed in the same manner so that the same amplitude distortion is introduced into the original monotonic ramping reference waveform to form a processed reference waveform, the processed monotonic ramping reference waveform thereby having the same amplitude distortion as is introduced into the original information signal to form a processed information signal, the apparatus comprising means responsive to the processed amplitude distorted monotonic ramping reference waveform during different times of the waveform and indications of the predetermined amplitude thereof at each of the different times corresponding to the full range of values for storing a series of indications having values correlating each of the predetermined amplitudes with an amplitude of the processed amplitude distorted reference waveforms, and means for modifying the amplitude of the amplitude distorted processed analog information signal by a factor determined by the stored correlated value indication corresponding with the amplitude of the processed information signal so that the amplitude of the modified processed information signal is commensurate with the amplitude of the original information signal prior to processing.

28. The apparatus of claim 27 wherein the means for deriving the stored values includes means for comparing the amplitudes of the distorted reference waveform with predetermined amplitudes therefor at plural times while the distorted reference waveform is being derived to derive an indication of the relative polarity and numerical values of the distorted reference waveform and the predetermined value therefor at each of the plural times, random access memory means for storing the indications of the relative polarity and numerical values to provide a correction factor for each of the plural amplitude values of the distorted processed information signal, means responsive to the amplitude of the distorted processed information signal for reading out from the random access memory means the correction factor associated with the different amplitudes thereof, and the means for modifying the amplitude of the processed information signal including means for combining the correction factor read out for a particular amplitude with the amplitude of the particular amplitude of the distorted processed information signal.

29. The apparatus of claim 27 wherein the means for deriving the stored values includes random access memory means for storing time values associated with the amplitude of the processed reference wave at memory addresses determined by the amplitude of the processed reference wave, and the means for modifying the amplitude of the processed information signal including means for reading out the stored time values from memory addresses of the random access memory means determined by the amplitude of the information signal, a read only memory for storing values for the amplitude of the original reference waveform, and means responsive to the read out stored time values for addressing the read only memory to read out the stored amplitude values for the original reference waveform at memory addresses associated with the time during the original reference waveform corresponding to the amplitude of the reference waveform at that time.

30. The apparatus of claim 27 wherein the means for deriving the stored values includes a read only memory means for storing amplitude values of the original reference wave for predetermined time positions during the processed reference wave, means for addressing the read only memory means at addresses determined by the amplitude of the processed reference wave, the means for modifying including random access memory means for storing the amplitude values read out of the read only memory means at addresses determined by the amplitudes of the processed reference wave, and means responsive to the processed information signal for addressing the random access memory means to read out the amplitudes of the original reference wave amplitudes stored in the random access memory means.

31. The apparatus of claim 27 wherein the original reference waveform is an increasing monotonic ramping function.

* * * * *